United States Patent [19]

Meinel et al.

[11] 4,131,485
[45] Dec. 26, 1978

[54] SOLAR ENERGY COLLECTOR AND CONCENTRATOR

[75] Inventors: Aden B. Meinel; Walter B. Meinel, both of Tucson, Ariz.

[73] Assignee: Motorola, Inc., Schaumburg, Ill.

[21] Appl. No.: 883,558

[22] Filed: Mar. 6, 1978

Related U.S. Application Data

[63] Continuation-in-part of Ser. No. 822,583, Aug. 8, 1977, abandoned.

[51] Int. Cl.$^2$ .......................... H01L 31/04; F24J 3/02
[52] U.S. Cl. .............................. 136/89 PC; 126/270; 126/271; 136/206; 350/294
[58] Field of Search .......................... 136/89 PC, 206; 126/270, 271; 350/293, 294

[56] References Cited

U.S. PATENT DOCUMENTS

| | | | |
|---|---|---|---|
| 3,085,565 | 4/1963 | Macauley | 126/270 |
| 3,254,342 | 5/1966 | Miller | 343/781 |
| 3,443,086 | 5/1969 | Rikis | 240/41.1 |
| 3,887,263 | 6/1975 | Thompson | 350/7 |
| 3,929,510 | 12/1975 | Kittl | 136/206 |
| 3,988,166 | 10/1976 | Beam | 136/89 |
| 4,024,852 | 5/1977 | L'Esperance et al. | 126/270 |
| 4,045,246 | 8/1977 | Mlavsky et al. | 136/89 PC |

Primary Examiner—John H. Mack
Assistant Examiner—Aaron Weisstuch
Attorney, Agent, or Firm—Robert D. Lott; M. David Shapiro

[57] ABSTRACT

Modular structures for the collection, concentration and conversion of solar energy to another usable form such as electrical energy. The structures feature three conic section reflective surfaces, two of which focus in front of a receiver element and off the axis of the structure. The third reflective surface is utilized to redirect that energy which would otherwise miss the receiver element to improve overall efficiency.

33 Claims, 6 Drawing Figures

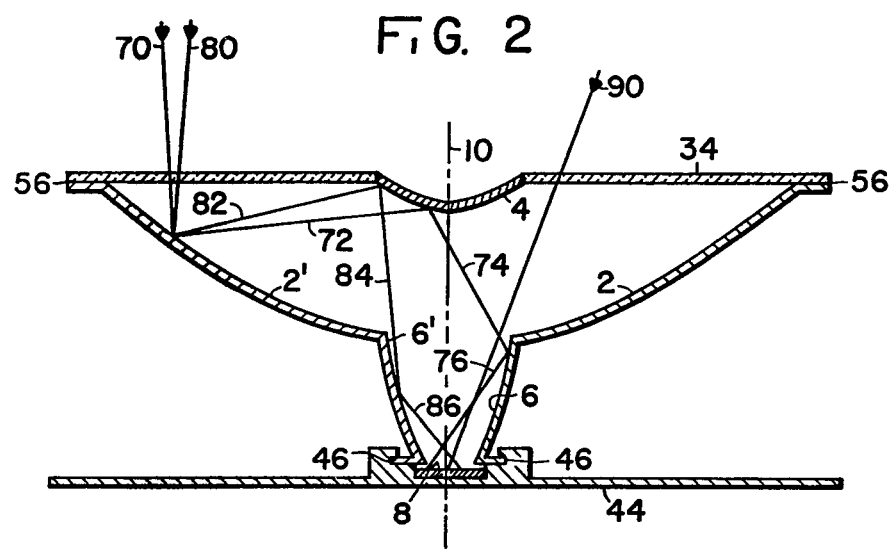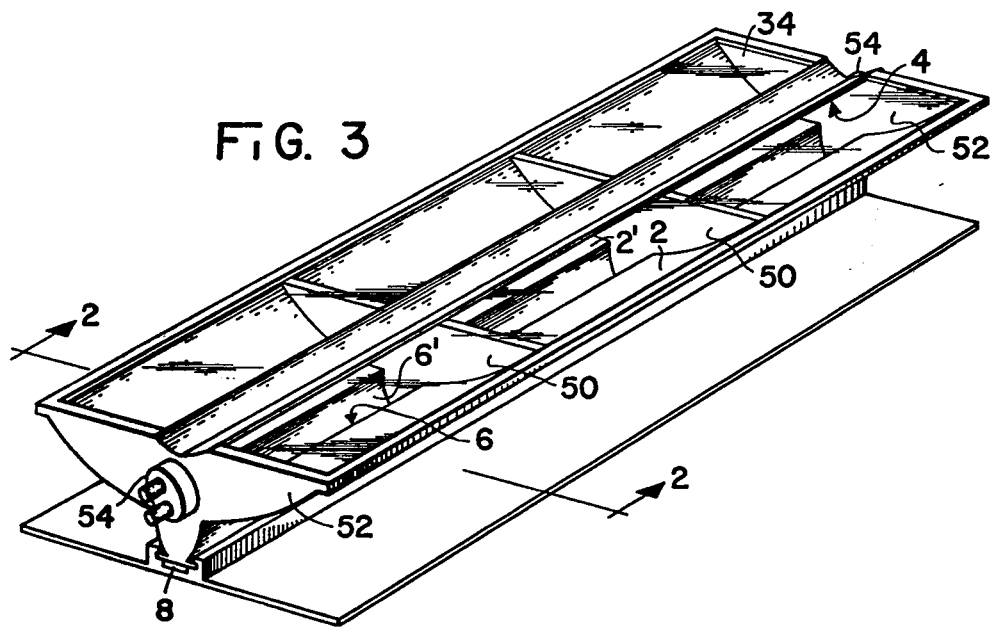

SOLAR ENERGY COLLECTOR AND CONCENTRATOR

FIELD OF THE INVENTION

This application is a continuation-in-part of application Ser. No. 822,583 filed Aug. 8, 1977, now abandoned.

The invention relates to a three element reflective system for collecting and concentrating solar energy on a receiver surface.

BACKGROUND OF THE INVENTION

Prior art in the area of solar collection is replete with examples of the use of folded reflective optical systems. Beam's U.S. Patent No. 3,988,166 is typical and represents the closest art found in this area. Levi-Setti's U.S. Patent No. 3,899,672 reveals an optical collection apparatus which is non-imaging; that is, no image of the energy source is formed at the exit aperture of the structure. Levi-Setti also sets out the two inherent requirements of effective solar collectors: (1) that they effectively concentrate energy from a larger area into a higher level of energy over a smaller area, and (2) that the structure be able to accept energy from the solar source in spite of diurnal and seasonal changes in the relative positions of source and collector. He also points out that the two requirements are generally in conflict, one with the other, in that the more effective the energy concentration is, the more difficult the tracking problem becomes. Levi-Setti points out that as the acceptance angle of the optical structure decreases (which is generally accompanied by an increased concentration factor), the time during which effective concentration will occur during a given day becomes shorter and more tracking is required for an effective system, or, as the concentration factor increases, there is a necessity generated for more diversely directed collectors operated in concert. In the latter case, much of the collector capacity goes unused during the available daylight period because of lack of illumination at the output apertures of the majority of the units. This means that the utilization of capital investment is relatively poor in those systems which depend upon multiple collectors in lieu of a single unit plus tracking mechanisms unless there exists a good tradeoff between the cost of the extra collectors and the cost of the tracking mechanism for a single unit.

SUMMARY OF THE INVENTION

According to the present invention, a non-imaging modular optical system is utilized to collect and concentrate solar energy. The system employs two reflective surfaces with a nominal ray crossover point in front of the receiving element which distributes the available energy uniformly across the receiving element to avoid hot spot problems. The system also is provided with a third reflective surface which serves to direct stray energy to the receiving element whether the stray energy be the result of low quality reflective surfaces or less than perfect tracking of the system with respect to the energy source.

Therefore, according to one aspect of the invention, uniform illumination of the receiving element is accomplished by the use of an off axis conical second reflector with a nominal ray crossover point short of the receiving element.

According to another aspect of the invention, a third reflector is used to enable stray energy due to aiming inaccuracy to impinge on the receiving element.

According to still another aspect of the invention, a third reflector is used to collect energy which would otherwise miss the receiver element because of poor collimation of the energy within or without the system.

According to a further aspect of the invention, a relatively shallow energy collector is realized which uniformly distributes energy onto a receiving element which is essentially tangential to the primary reflector.

These and other aspects and features of the invention will be better understood upon reading of the Detailed Description of the Invention together with inspection of the drawings in which:

FIG. 2 is a cross section of another embodiment of the invention which may be developed by sweeping the axis of the cross section through a plane.

FIG. 3 is a three dimensional view of the embodiment which is developed from the cross section of FIG. 2.

DETAILED DESCRIPTION OF THE INVENTION

Figure 1:
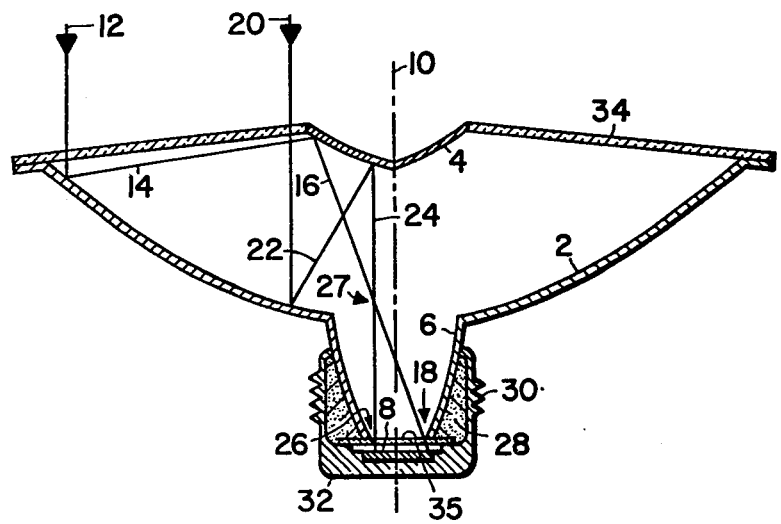
FIG. 1 is a cross section of an embodiment of the invention which may be developed by rotating the cross section of this Figure about its axis.

A cross section of one embodiment of the invention is shown in FIG. 1. This embodiment of the invention is developed by rotating the cross section of FIG. 1 on axis 10 thereby creating a generally circular module. The optics of FIG. 1 may be better understood by following the detailed description of energy rays as shown in FIG. 1. Rays 12 and 20 represent input light energy parallel to axis 10 from a remote electromagnetic energy source which may be the solar source. Ray 12 enters the system through transparent portion 34 and is reflected from primary reflector 2 as ray 14. Ray 14 is directed to secondary reflector surface 4 and is reflected as ray 16. Ray 16 passes through transparent sealing plate 35 (if used) and impinges upon receiving element 8 at point 18. Ray 20 also enters the system through transparent portion 34 and is reflected from primary reflector 2 as ray 22. Ray 22 is directed to secondary reflector 4 and is reflected as ray 24. Ray 24 passes through transparent sealing plate 35 (if used) and impinges upon receiving element 8 at point 26. It will be clear that any ray entering transparent element 34 between rays 12 and 20 will also be reflected in order from reflective surfaces 2 and 4 and impinge on receiving element 8 between points 18 and 26. Rays of this sort are omitted from the illustration of FIG. 1 for clarity. It is important to note that rays 16 and 24 cross at point 27. This point lies between reflector surface 4 and receiving element 8. The system is arranged so that all rays which lie parallel to and between rays 12 and 20 will also cross approximately at point 27. Thus point 27 becomes the nominal ray crossover point for the folded optical system comprising reflective elements 2 and 4. When the cross section of FIG. 1 is rotated around axis 10 it becomes clear that point 27 is also rotated therearound and, thus, crossover point 27 defines a crossover ring. This crossover ring is, by design, located between reflective surface 4 and receiving element 8. Since ray 12, 14 and 16 and ray 20, 22 and 24 represent extremes of the input rays along a radius of the system, it is clear that all rays in that radius are arranged to be distributed across receiving element 8 between points 18 and 26. It then may be further seen that input rays along any other radius of the system will be distributed completely across the diameter of receiving element 8. However, it should be noted that none of the other input rays are shown in FIG. 1 for purposes of clarity.

All input rays to the system do not enter in a manner such as rays 12 and 20 nor are all rays even parallel to rays 12 and 20. Because there may be energy input along other lines due to tracking errors such as is shown by rays 70, 80 and 90 in FIG. 2 (omitted from FIG. 1 for clarity), a third reflector 6 is introduced into the system between the aperture in reflector 2 and receiving element 8. As further shown by FIG. 2, by example, rays 70 and 80 are reflected by reflective surfaces 2 and are directed as rays 72 and 82 to reflective surface 4 and then as rays 74 and 84 to reflecting surface 6 and then as rays 76 and 86 to receiver element 8. Rays 70 and 80 represent approximately the angular limits of acceptable rays due to tracking errors or inaccuracies. Similarly, other rays which would otherwise miss element 8 because of fabrication or module alignment inaccuracies will be reflected by surface 6 to receiver element 8. Of course, ray 90 (and like rays) of FIG. 2 impinges element 8 directly without being reflected from any of the reflective surfaces of the module.

A diffuser plate (not shown) may be placed within the cavity of the third reflective surface 6 in order to diffuse the light as it passes toward receiver element 8 thereby making a more uniform light distribution over receiver element 8. Such a diffusion element is not shown in FIG. 1 in the interest of clarity of the drawing. Also, third reflector surface 6 may be either a smooth, continuous surface or a bumpy, textured reflective surface. It should be noted that the uniform distribution of rays from one radius of the system across receiver 8 does not assure a uniform brightness (i.e. energy) distribution on receiver 8 from the entire aperture of the module. For example, if the cross section of FIG. 1 is rotated around center axis 10 to form a circular module, then a uniform distribution of the rays from one radius of the system across receiver 8 would not produce a uniform brightness or energy distribution on receiver 8. This is due to the masking of the center portion of the primary receiver produced by the shadow of the secondary receiver and the necessary extension of the rays striking the primary receiver to compensate for the shaded area. Those skilled in the art will understand that the control of the brightness and energy distribution on surface 8 is further accomplished by allowing surfaces 2 and 4 to depart from true conic sections as may be desired.

Reflective surfaces 2, 4 and 6 may be either on the inside or the outside of the module of FIG. 1, but for reasons which will become apparent, it is preferable to put the reflective surfaces on the inside.

Receiver element 8 may be a photovoltaic cell or other light absorbing device. It will preferably have a diameter similar to the lower aperture in reflector element 6. Since at the time of the making of this invention photovoltaic cells of the type which would be expected to be employed in the invention have a maximum efficiency of about 20 percent, it is apparent that the 80 percent of the energy input which is lost must be dissipated to avoid overheating receiving element 8. A heat sinking arrangement is therefore provided. Shell 32 (see FIG. 1) extends around receiving element 8 and around reflector surface 6 and is provided with threads 30. Heat conducting material 28 is provided between reflective surface 6 and shell 32. Photovoltaic cell 8 is soldered or otherwise attached to shell 32. This arrangement allows shell 32 to be screwed into a receptacle, similar to an electric light bulb receptacle (not shown) for mounting of the module of FIG. 1. This provides good heat conduction from receiver element 8 into the receptacle (not shown) thereby removing excessive heat from receiver element 8.

In the fabrication of the embodiment of the invention as shown in FIG. 1 it would be expected that reflective surface 4 and transparent element 34 might be fabricated from one piece of material. The material might be either glass or plastic with transparent section 34 as shown and preferably with the reflective surface on the inner side of reflective portion 4. Reflective surfaces 2 and 6 may also be fabricated from a single piece of material, for example glass, plastic or metal. Here again, it is preferable to render the inside surfce reflective in order to avoid losses in the material. When carefully sealed joints are made between transparent surface 34 and reflector surface 2 and between reflective surface 6 and receiving element 8 or transparent plate 35, the module of FIG. 1 becomes a sealed unit which is less subject to contamination by dirt, at least on the interior surfaces. Maintenance of such a sealed module becomes a simple matter of keeping transparent surface 34 clean. Heat transfer material 28 between reflective surface 6 and shell 32 may be a mixture of plastic and metal, or where reflective surface 6 is made of metal the heat transfer material 28 may take the form of solid metal, possibly even cast as a portion of reflective surface 6. This sort of fabrication lends itself to the feasibility of rolling shell 32 around heat transfer material 28 at the open end of shell 32. Of course other techniques will occur to one skilled in the art which would be equally satisfactory.

Figure 1A:
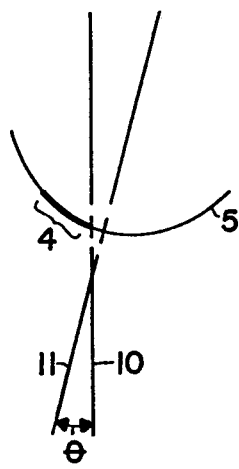
FIG. 1A is a further detail of the development of reflective surface 4 of FIG. 1.
Figure 1B:
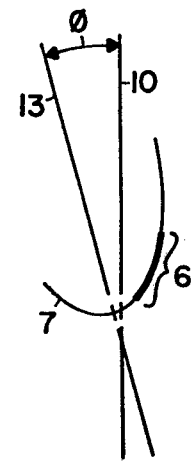
FIG. 1B is a further detail of the development of reflective surface 6 of FIG. 1.

Reflective surfaces 2, 4 and 6 are illustrated in FIG. 1 as smooth conical section surfaces. Reflective surface 6 may be either a smooth continuous surface or textured reflective surface. Any of the reflective surfaces may be alternately divided into discrete elements as is typified by Fresnel mirrors. Reflective surface 2 should preferably take an approximately parabolic shape with an axis coincident or substantially coincident with axis 10 of the module. Surface 4 is preferably approximately hyperbolic with an axis slightly tilted from axis 10 of the module. FIG. 1A further illustrates the development of the shape and position of reflective surface 4. Hyperbola 5 has axis 11 which is tilted through angle $\Theta$ and can be offset from axis 10 of the module of FIG. 1. Reflective surface 4 is one segment of hyperbola 5. It is the slight tilting of axis 11 of the hyperbola of surface 4 which cause the nominal ray crossover point to be off axis 10 of the module. Further, the hyperbolic section selected is so selected as to provide for a nominal ray crossover point which is short of the distance from reflective surface 4 to receiver element 8. This is clearly shown at point 27 in FIG. 1. Reflective surface 6 of FIG. 1 is preferably approximately an elliptic section with the axis of the ellipse being at an angle $\phi$ with respect to axis 10 of the module. FIG. 1B illustrates this in more detail. The ellipse 7 has axis 13 set at angle $\phi$ from module axis 10. Reflective surface 6 is a portion of ellipse 7. The axis of ellipse 7 can be parallel and coincident with axis 10, but capability to redirect rays to receiver 8 is improved if axis 7 of the third conic is inclined as shown in FIG. 1B In practice, small deviations between coincidence of axis 10 with the axis of reflector surface 2 or deviation of reflector surface 4 from its optimum position will cause some of the rays from reflector surface 4 to miss receiving element 8. As has been previously discussed, this situation is corrected by the presence of reflector surface 6 which redirects such stray rays back to receiver element 8. Therefore, it may be seen that small errors caused by inaccuracies in fabrication of the module of FIG. 1 are corrected by the presence of reflector surface 6. Similarly, if rays 12 and 20 and the like do not enter the module of FIG. 1 parallel to axis 10 some of them also miss receiver element 8, absent the presence of reflector surface 6. However, reflector surface 6 does allow for inaccuracies in pointing of the module of FIG. 1 such that all of the entry rays such as rays 12 and 20 will eventually be reflected to receiver element 8 even when they are influenced by inaccuracies in the pointing or tracking of the module of FIG. 1 with respect to the solar source.

All of the reflective surfaces described above are circularly symmetrical about the axis of rotation 10, which is not necessarily the optical axis of either parabolic surface 2, hyperbolic surface 4 or elliptical surface 6 described above. Requirement that departures from coincidence of the optical axis of the module with the axis of symmetry 10 be small is set by the functional requirement that the spot of concentrated sunlight on the receiver is uniform over the lateral extent of the receiver and that this energy from each side of the optical configuration overlap on the receiver in the embodiment of FIG. 1 and FIG. 2.

In a normal Cassegrain configuration, ray 14, after reflection by the hyperbolic mirror 4, would procede to the intersection of axis 10 with receiver 8. But a tilt is introduced into surface 4 so that ray 16 actually impinges on receiver 8 near its edge at point 18. The relative positions of reflective surfaces 4 and 2 are important; they are positioned so that they form a modified Cassegrain configuration having its focus at point 27. The combination of the curvatures for mirrors 2 and 4 is such that the nominal ray crossover point 27 lies between reflective surface 4 and receiver element 8, allowing considerable latitude in the choices of the parabolic and hyperbolic curves.

It will be well understood that where the module of FIG. 1 is sealed to prevent breathing in the space within the optical module, the walls in the module must be rigid enough to withstand variation of internal pressure due to heating of the module or fluctuations in ambient air pressure and/or temperature. A transparent glass or plastic cover may be introduced to improve the seal at the exit aperture of reflector surface 6. This is shown in FIG. 1 by the presence of optional glass plate 35 between the exit aperture of reflector 6 and receiver element 8.

A second embodiment of the invention is shown in FIGS. 2 and 3. FIG. 3 illustrates a three dimensional view of this embodiment of the invention while FIG. 2 is a typical cross section of FIG. 3. The structure of FIG. 3 is developed from the cross section of FIG. 2 by sweeping axis 10 of FIG. 2 through a plane. The optical arrangement of the cross section of FIG. 2 is substantially the same as that of FIG. 1 which has already been described. For this reason parallel entry rays from the solar source are not shown. The cross section of FIG. 2 does vary from that of FIG. 1. A formed foot at the lower end of reflective surface 6 is engaged in a slot formed in heat dissipating plate 44 at point 46. In FIG. 2 receiving element 8 appears to be the same as in the cross-sectional view of receiving element 8 in FIG. 1, but it should be clearly understood that in FIG. 3 receiver element 8 is actually of a ribbon form. That is, receiver element 8 extends the full length of the module of FIG. 3. As in the embodiment of the invention illustrated in FIG. 1, the three linear reflecting surfaces can be combined into an integral module thereby providing protection of the reflecting surfaces from environmental degradation. Also, as in FIG. 1, the configuration of FIGS. 2 and 3 has an acceptance angle for sunlight that permits generous manufacturing errors in the optical surfaces or errors in pointing of the module toward the sun, an important pair of characteristics when the practical and economic aspects of the solar collectors are considered.

The basic optical configuration in both embodiments consists of three linear reflecting surfaces, the first two forming a low quality image of the source and the third acting to bring rays that would otherwise miss the receiver back to the receiver. When these three reflective surfaces are made an integral part of the structure of the module, a fourth optical part, a transparent window, becomes part of the optical module. The function of the optical modules is the same however with or without the window. In the configuration of FIGS. 2 and 3 the final strip of sunlight on the receiver element is not what is termed a focus of the optical module since the nominal focus lies well within the optical module; therefore this collector can also be described as a non-imaging optical system. However, in the case of the configuration of FIGS. 2 and 3 the module is one having a plane of symmetry rather than an axis of symmetry. When the optical module and the module structure are combined the enclosure would be made of a transparent material like glass or plastic for the portion having a window through which sunlight enters the module. Portions where the sunlight does not need to pass can be made of any material that can provide the highly reflective surfaces needed for the mirror portions. While there are a wide variety of ways in which the optical module can be attached to a using system the embodiment of FIGS. 2 and 3 illustrate the use of flanges in slots at points 46. Then, of course, the module of FIGS. 2 and 3 can function properly with receiver 8 external to the module or contained in or as part of the module. As in the embodiment of FIG. 1, this embodiment may utilize reflector surfaces which are either single, smooth curves or surfaces which are divided into discrete elements as is typified by Fresnel mirrors. Since in either embodiment of the invention, or for that matter, in any other collecting and concentrating system involving photovoltaic cells, such as receiver element 8 may be, there is generally a requirement for some way of dissipating the heat generated by the surplus adsorbed sunlight energy. The optical module may be filled with a liquid or transparent solid that distributes the heat to the entire shell of the module through natural convection or conduction of the fluid. In the presence of such a filler the optical behavior of the module is only slightly affected, particularly the refraction of the solar rays entering the module. The descriptions given here, however, are adequate to describe the optical characteristics of the module with or without a liquid or solid filling. FIG. 2 illustrates a cross section of a linear optical module, such as is shown in the three dimensional view of FIG. 3, with an axis of lateral symmetry 10. The module consists of three parts, the upper portion comprising window 34 and reflector 4, and two identical lower portions comprising reflective elements 2 and 2' and reflective elements 6 and 6'. These lower portions are connected to the upper portion and preferably sealed at connecting points 56. The lower portions of reflectors 2, 2' and 6, 6' are provided with flanges which fit into slots in the heat plate sink 44 at points 46. As before stated, the optical description of the module may be understood by following the solar rays as shown in FIG. 1 since the optical cross sections of FIGS. 1 and 2 are essentially identical. But since the configuration of FIG. 3 is developed by moving axis 10 of FIG. 2 through a plane, point 27 in the optical diagram of FIG. 1 no longer represents a circle or ring. Rather, since point 27 is moved in a straight line parallel to the motion of axis 10 in the plane, and since the ray diagram is symmetrical about axis 10, the nominal ray crossover point is represented by two lines, one on either side of axis 10. But again, as in FIG. 1, the rays diverge from point 27 to the points where they impinge on receiver element 8 and the result is that a row of rays inputting the system along a line perpendicular to axis 10 will completely cover receiver element 8, as reflected thereon, in dual fashion. That is, the overlap of rays from one side of axis 10 completely overlap those rays which eminate from the opposite side of axis 10. Input energy ray lines which enter the system at an angle with respect to axis 10 will include some rays which, absent reflective surfaces 6 and 6', would not impinge on receiver element 8. As has been before stated, rays 70 and 80 of FIG. 2 represent rays which illustrate this case. However, in the presence of reflector 6 rays 70, 80 are redirected by reflector 6 to receiver element 8.

FIG. 3 which may be developed from FIG. 2 by moving axis 10 through a plane illustrates some additional elements of this embodiment of the invention. End plates 52 serve to help isolate the volume of the collector module of FIG. 3 from the exterior environment. Transparent partitions 50 are shown along the length of the optical module to stiffen the surfaces of the module and thereby reduce optical deformations that might otherwise occur. Transparent partitions 50 may also be opaque, but reflective, so as not to cause the loss of obliquely incident sunlight. End plates 52 may be transparent or reflective so as not to cause the loss of obliquely incident sunlight. Because of the relatively larger volume of the module of FIG. 3, heat sink plate 44 is attached but not sealed to the optical module so that air pressure changes will result in a slow exchange of air in the module. Of course, it will be understood that if the unit were to be completely sealed, a bellows or other type of expansion chamber might be used to compensate for temperature and pressure changes. End plates 52 are shown with connector sockets 54 installed. Connector sockets 54 may be used for physically attaching the module to a using structure and also, optionally, for electrical connections between receiver element 8 and the using structure.

Figure 4:
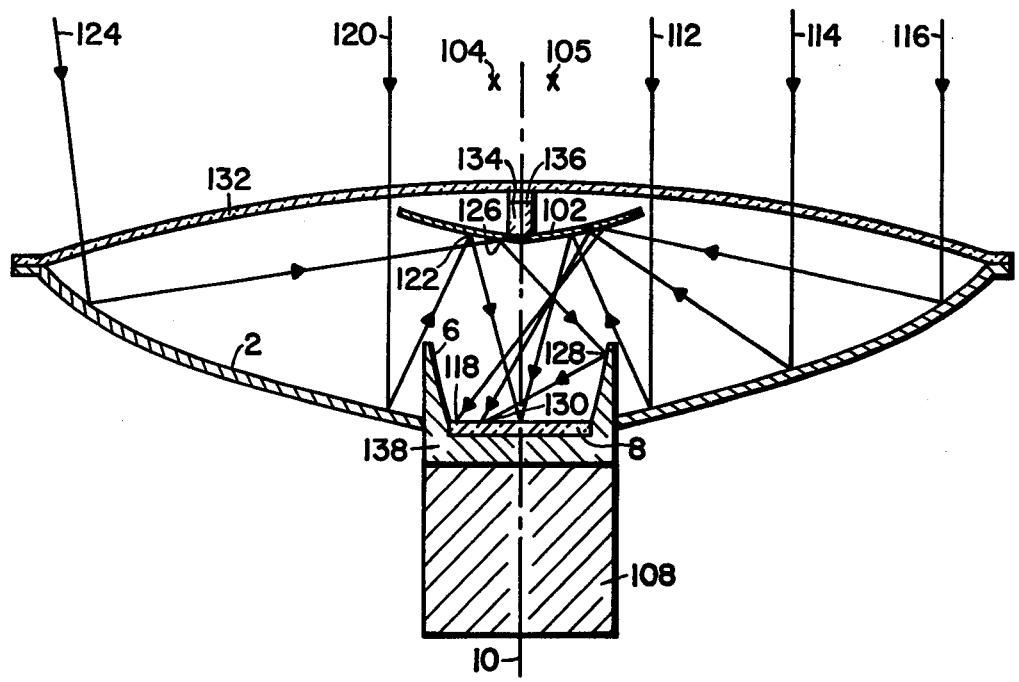
FIG. 4 is a cross section of another embodiment of the invention which may be developed either by rotating the cross section about its axis or by sweeping the axis of the cross section through a plane.

FIG. 4 is a cross section of another embodiment of the invention. This embodiment may be realized as a generally circular module by sweeping the cross section around axis 10 or may be realized as a generally trough-shaped module similar to that depicted in FIG. 3 by sweeping the cross section through a plane. The optical arrangement of the cross section of FIG. 4 is similar to that of FIGS. 1 and 2. A primary reflective surface 2 receives radiation from an electromagnetic source such as the sun and reflects the energy onto second reflector 102, which in turn reflects the radiant energy onto receiver element 8. The general shape of primary reflector 2 is substantially the same as that for FIGS. 1 and 2 in that it is a conical concave reflector having a center aperture for holding a receiving element 8 contained within third reflector element 6. Third reflector element 6 is similar to reflector element 6 of FIGS. 1 and 2 in that it is generally a concave conical section having its axis off center axis 10 of the cross section of FIG. 4.

However, the embodiment of FIG. 4 departs from that of FIG. 1 and FIG. 2. Receiving element 8, which is set on a line below the curvature plane of primary reflector 2 of FIGS. 1 and 2, is now substantially tangential to primary reflector 2 of FIG. 4 to thereby provide a shallower apparatus than that shown in the previous embodiments. This shallow configuration results in part from the modified distribution of rays on receiving element 8. The incoming rays falling on the right hand side of axis 10 are evenly distributed only on the left hand side of receiver element 8. Similarly, those incoming rays falling on the left hand side of axis 10 of the apparatus are directed towards the right hand side of receiving element 8. This right-to-left-hand and left-to-right-hand transfer of the incoming rays allows receiving element 8 to be brought up into a position substantially trangential to primary reflector 2. The paths of these rays are discussed in more detail below. The embodiment of FIG. 4 is also similar to FIG. 1 and FIG. 2 in that heat sinking element 108 is attached to reflecting surface 6 to provide heat transfer from receiving element 8 to thereby prevent overheating of element 8. The embodiment shown in FIG. 4 indicates air-cooled fin 108, however it will be understood that either of the threaded base of FIG. 1 or the flanged foot of FIG. 2 or any other heat sinking means could also be used as a heat sink for receiver 8.

Turning to the rays depicted in FIG. 4, incoming rays 112, 114, and 116 impinging on the right hand side of primary reflector 2 are reflected onto the right hand side of secondary reflector 102 and subsequently reflected onto receiving element 8 such that incoming ray 112 which is closest to center axis 10 is reflected to center axis 10 of receiving element 8. Conversely, incoming ray 116 which is farthest from axis 10 impinges on receiving element 8 on the far left hand side shown at point 118. Analogously incoming ray 120, which just misses secondary reflector 102, impinges on receiving element 8 at center axis 10 after being reflected from secondary reflector 102 at point 122. Thus, it can be seen that the rays entering on the right hand side of the axis 10 impinge on receiving element 8 to the left of center axis 10, and those entering on the left of axis 10 impinge on receiving element 8 on the right hand side of axis 10. Incoming ray 124 indicates the use of third reflector 6 for conditions where the apparatus is not pointing directly at the electromagnetic radiation source. Incoming ray 124 is reflected off secondary reflector 102 at point 126 striking third reflector 6 at point 128 and is further reflected onto receiving element 8 at point 130. This operation is the same as for off axis rays 70, 80, 90, discussed in conjunction with FIG. 2. Thus the configuration of FIG. 4 has an acceptance angle for sunlight that permits generous manufacturing errors in the optical surfaces or errors in pointing of the module toward the sun.

It will be appreciated by those skilled in the art that the curvature of the primary reflector and the secondary reflector are a matter of choice as long as they produce in combination the desired placement of the incoming rays onto receiver element 8. A convenient curvature for second reflector 102 of FIG. 4 is two sections of a circle with the center of both circles being off axis 10 of the cross section. Thus, in FIG. 4, the right hand portion of reflector 102 has a center locus at 104, and the left hand portion has a locus at 105. The curvature of primary reflector 2 has approximately a parabolic shape, the exact dimensions of which are derived by standard techniques of the art.

The cross section of FIG. 4 also differs from the cross sections of FIGS. 1 and 2 in that secondary reflector 102 is not an integral part of transparent dome 34 of FIGS. 1 and 2 but rather is supported from transparent dome 132 of FIG. 4 by supporting rod 134. Supporting rod 134 also contains an insulating collar 136 which helps to prevent the heat generated on the second reflective surface by the reflected sunlight from overheating the dome, which in some instances may be plastic, thus deforming transparent dome 132. Collar 136 can also be shimmed in an appropriate manner to provide fine positioning a secondary reflective surface 102. Note that it would also be possible to support second reflective surface 102 by supporting bars mounted from second reflector 102 to shell 138 which supports reflector 6 and extends around receiving element 8. This configuration would have the added advantage that deformations in the reflective surfaces due to heating and cooling of the surfaces would not change the relative distance from the first reflective surface to the second reflective surface.

Except for the differences noted, the embodiment of FIG. 4 has substantially the same characteristics and the same possible variations described for FIGS. 1 and 2. For instance, the surfaces may be smooth or may be made up of a plurality of fresnel mirrors and a diffuser plate may be placed over the receiving unit to aid in providing even energy distribution along receiving unit 8.

Finally, it is also possible to place onto reflective surface 6 of FIGS. 1, 2 or 4 light sensing means which would detect a module which is not pointing directly into the sun. A correct positioning of the apparatus will result in equal amounts of light shining on both sides of reflective surface 6, but an error in alignment will cause one side of the reflective surface 6 to be brighter than the opposite side. Thus, using differential means, it would be possible to detect aligning errors in the apparatus.

Various other modifications and changes may be made to the present invention from the principles of the invention as described above without departing from the spirit and scope thereof as encompassed in the accompanying claims.

What is claimed is:

1. An apparatus for collecting energy from a remote electromagnetic radiation source, the apparatus having a cross section generally symmetrical about an axis, a cross section of the apparatus comprising in combination:

first reflective means for collecting and reflecting the energy from the remote source, said first reflective means being concave and having a shape generally of a conic section, said first conic section shape having an axis substantially coincident with the axis of the apparatus, said first reflective means having an aperture around said apparatus axis;

second reflective means spaced from said first reflective means for collecting said energy reflected from said first reflective means and for further reflecting the energy through said aperture in said first reflective means, that portion of said second reflective means lying on one side of the axis of the apparatus and facing said first reflective means being convex and having a shape generally of a conic section, said second conic section shape having an axis being angularly displaced from the axis of the apparatus; and receiving means for absorbing said further reflected energy, a nominal ray crossover point of said further reflected energy being between said second reflective means and said receiving means, said receiving means being positioned to receive said further reflected energy through said aperture in said first reflective means, said further reflected energy being thereby dispersed generally over said receiving means.

2. The apparatus according to claim 1 wherein:
   a third reflective means for reflecting electromagnetic radiation energy is connected between said first reflective means at said aperture and a perimeter of said receiving means, said third reflective means having a shape generally of a conic section.

3. The apparatus according to claim 2 wherein the apparatus is further defined by rotating the cross section about the axis of the apparatus to develop a structure having circular cross sections.

4. The apparatus according to claim 3 wherein:
   said third reflective means is enclosed and connected to a shell, said shell having on the outer surface thereof connecting means for connecting the apparatus to a using structure.

5. The apparatus according to claim 4 wherein said shell comprises a heat sink.

6. The apparatus according to claim 3 comprising:
   transparent means for supporting said second reflective means and for allowing transmission of electromagnetic energy therethrough, said transparent means having an outer perimeter, said outer perimeter being coextensive with an outer perimeter of said first reflective means.

7. The apparatus according to claim 2 wherein the apparatus is further defined by moving the axis of the apparatus in a plane to develop a trough-like structure of modular form.

8. The apparatus according to claim 7 wherein:
   heat sink means for dissipating excess energy from said receiving means is connected to said receiving means.

9. The apparatus according to claim 7 comprising
   transparent means for supporting said second reflective means and for allowing transmission of electromagnetic energy therethrough, said first reflective means and said transparent means having outer extremities thereof, said outer extremities of said first reflective means and said transparent means being coextensive.

10. The apparatus according to claim 2 wherein said conic section of said third reflective means is angularly displaced from the axis of the apparatus.

11. The apparatus according to claim 1 wherein said receiving means comprises a photovoltaic cell.

12. An apparatus for collecting energy from a remote electromagnetic radiation source, the apparatus having a cross section generally symmetrically about an axis, a cross section of the apparatus comprising in combination:

first reflective means for collecting and reflecting the energy from the remote source, said first reflective means being concave and having a shape generally of a conic section, said first conic section shape having an axis substantially coincident with the axis of the apparatus, said first reflective means having an aperture around said apparatus axis;

second reflective means spaced from said first reflective means for collecting said energy reflected from said first reflective means and for further reflecting the energy through said aperture in said first reflective means, that portion of said second reflective means lying on one side of the axis of the apparatus and facing said first reflective means being convex and having a shape generally of a conic section, said second conic section shape having an axis being angularly displaced from the axis of the apparatus, said second reflective means having a nominal ray crossover point of said further reflected energy lying off the axis of the apparatus, and receiving means for absorbing said further reflected energy, said receiving means comprising a receiving surface area, said nominal ray crossover point of said further reflected energy being between said second reflective means and said receiving means, said receiving means being positioned to receive said further reflected energy through said aperture in said first reflective means, said further reflected energy being thereby dispersed generally over said receiving means.

13. The apparatus according to claim 12 wherein:
a third reflective means for reflecting electromagnetic radiation energy is connected between said first reflective means at said aperture and a perimeter of said receiving means, said third reflective means having a shape generally of a conic section.

14. The apparatus according to claim 13 wherein the apparatus is further defined by rotating the cross section about the axis of the apparatus to develop a structure having circular cross sections.

15. The apparatus according to claim 14 wherein:
said third reflective means is enclosed and connected to a shell, said shell having on the outer surface thereof connecting means for connecting the apparatus to a using structure.

16. The apparatus according to claim 15 wherein said shell comprises a heat sink.

17. The apparatus according to claim 14 comprising:
transparent means for supporting said second reflective means and for allowing transmission of electromagnetic energy therethrough, said transparent means having an outer perimeter, said outer perimeter being coextensive with an outer perimeter of said first reflective means.

18. The apparatus according to claim 13 wherein the apparatus is further defined by moving the axis of the apparatus in a plane to develop a trough-like structure of modular form.

19. The apparatus according to claim 18 wherein:

heat sink means for dissipating excess energy from said receiving means is connected to said receiving means.

20. The apparatus according to claim 18 comprising:
transparent means for supporting said second reflective means and for allowing transmission of electromagnetic energy therethrough, said first reflective means and said transparent means having outer extremities thereof, said outer extremities of said first reflective means and said transparent means being coextensive.

21. The apparatus according to claim 13 wherein said conic section of said third reflective means is angularly displaced from the axis of the apparatus.

22. The apparatus according to claim 12 wherein said receiving means comprises a photovoltaic cell.

23. An apparatus for collecting energy from a remote electromagnetic radiation source, the apparatus having a cross section generally symmetrical about an axis and having a right side and a left side, a cross section of the apparatus comprising in combination:

first reflective means for collecting and reflecting the energy from the remote source, said first reflective means being concave and having a shape generally of a conic section, said first conic section shape having an axis substantially coincident with the axis of the apparatus, said first reflective means having an aperture around said apparatus axis;

second reflective means spaced from said first reflective means for collecting said energy reflected from said first reflective means and for further reflecting the energy through said aperture in said first reflective means, that portion of said second reflective means lying on one side of the axis of the apparatus and facing said first reflective means being convex and having a shape generally of a conic section, said second conic section shape having an axis being angularly displaced from the axis of the apparatus; and receiving means for absorbing said further reflected energy, said receiving means comprising a receiving surface area, a nominal ray crossover point of said further reflected energy being between said second reflective means and said receiving means, said receiving means being positioned to receive said further reflected energy through said aperture in said first reflective means, said further reflected energy being derived from the energy of the remote source impinging of the right side of the apparatus being thereby dispersed generally over a left side of said receiving means, and said further reflected energy being derived from the energy of the remote source impinging of the left side of the apparatus being thereby dispersed generally over a right side of said receiving means.

24. The apparatus according to claim 23 wherein:
a third reflective means for reflecting electromagnetic radiation energy is connected between said first reflective means at said aperture and a perimeter of said receiving means, said third reflective means having a shape generally of a conic section.

25. The apparatus according to claim 24 wherein the apparatus is further defined by rotating the cross section about the axis of the apparatus to develop a structure having a circular cross section.

26. The apparatus according to claim 25 wherein:
said third reflective means is enclosed and connected to a shell, said shell having on the outer surface thereof connecting means for connecting the apparatus to a using structure.

27. The apparatus according to claim 26 wherein said shell comprises a heat sink.

28. The apparatus according to claim 25 comprising: transparent means for supporting said second reflective means and for allowing transmission of electromagnetic energy therethrough, said transparent means having an outer perimeter, said outer perimeter being coextensive with an outer perimeter of said first reflective means.

29. The apparatus according to claim 24 wherein the apparatus is further defined by moving the axis of the apparatus in a plane to develop a trough-like structure of modular form.

30. The apparatus according to claim 29 wherein: heat sink means for dissipating excess energy from said receiver means is connected to said receiver means.

31. The apparatus according to claim 29 comprising: transparent means for supporting said second reflective means and for allowing transmission of electromagnetic energy therethrough, said first reflective means and said transparent means having outer extremities thereof, said outer extremities of said first reflective means and said transparent means being coextensive.

32. The apparatus according to claim 24 wherein said conic section of said third reflective means is angularly displaced from the axis of the apparatus.

33. The apparatus according to claim 23 wherein said receiving means comprises a photovoltaic cell.

* * * * *